(12) United States Patent
Levillain

(10) Patent No.: US 10,597,196 B2
(45) Date of Patent: *Mar. 24, 2020

(54) TAMPER-EVIDENT MESH MATERIAL AND METHODS OF MANUFACTURE THEREFOR

(71) Applicant: JX Nippon ANCI, Inc., Kennesaw, GA (US)

(72) Inventor: Marc Levillain, Les Milles (FR)

(73) Assignee: JX NIPPON ANCI, INC., Kennesaw, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/786,418

(22) Filed: Oct. 17, 2017

(65) Prior Publication Data
US 2018/0037370 A1 Feb. 8, 2018

Related U.S. Application Data

(63) Continuation-in-part of application No. 15/494,471, filed on Apr. 22, 2017, now Pat. No. 10,112,740.
(Continued)

(51) Int. Cl.
| | |
|---|---|
| *B65D 33/00* | (2006.01) |
| *B65D 55/02* | (2006.01) |
| *B65D 33/34* | (2006.01) |
| *D04H 13/02* | (2006.01) |
| *B65D 30/00* | (2006.01) |

(Continued)

(52) U.S. Cl.
CPC .......... *B65D 33/004* (2013.01); *B29C 55/045* (2013.01); *B65D 29/00* (2013.01); *B65D 29/02* (2013.01); *B65D 33/34* (2013.01); *B65D 55/026* (2013.01); *C23C 14/12* (2013.01); *C23C 14/185* (2013.01); *C23C 14/20* (2013.01); *C23C 14/24* (2013.01); *C23C 14/34* (2013.01); *D04H 1/4234* (2013.01); *D04H 1/4374* (2013.01); *D04H 1/559* (2013.01); *D04H 1/74* (2013.01);
(Continued)

(58) Field of Classification Search
CPC ...... B65D 33/004; B65D 29/02; C23C 14/12; C23C 14/185; C23C 14/24; C23C 14/34; D04H 1/4234; D04H 1/4374; D04H 1/559; D04H 1/74
USPC .................................................... 383/5, 117
See application file for complete search history.

(56) References Cited

U.S. PATENT DOCUMENTS

| | | | |
|---|---|---|---|
| 4,749,084 | A | 6/1988 | Pereyra |
| 5,190,812 | A | 3/1993 | Joseph |

(Continued)

FOREIGN PATENT DOCUMENTS

| | | | |
|---|---|---|---|
| WO | 2009/011853 A1 | 1/2009 | |
| WO | 2012/035546 A2 | 3/2012 | |

OTHER PUBLICATIONS

USPTO, Notice of Allowance issued regarding U.S. Appl. No. 15/494,471, 9 pages, dated Jun. 27, 2018.
(Continued)

*Primary Examiner* — Peter N Helvey
(74) *Attorney, Agent, or Firm* — Thompson Hine LLP

(57) ABSTRACT

The present invention is directed to tamper-evident mesh material, methods of manufacture therefor, and tamper-evident bags manufactured therefrom. The tamper-evident mesh material of the present invention may be used, for example, in the manufacture of a variety of tamper-evident security bags for use in applications where it is desirable to detect any traces or evidence of tampering with or of unauthorized access to the contents of the bag.

32 Claims, 13 Drawing Sheets

Related U.S. Application Data

(60) Provisional application No. 62/326,683, filed on Apr. 22, 2016.

(51) Int. Cl.
| | |
|---|---|
| *C23C 14/20* | (2006.01) |
| *D04H 3/045* | (2012.01) |
| *B65D 30/08* | (2006.01) |
| *C23C 14/12* | (2006.01) |
| *C23C 14/18* | (2006.01) |
| *C23C 14/24* | (2006.01) |
| *C23C 14/34* | (2006.01) |
| *D04H 1/4234* | (2012.01) |
| *D04H 1/4374* | (2012.01) |
| *D04H 1/559* | (2012.01) |
| *D04H 1/74* | (2006.01) |
| *G09F 3/00* | (2006.01) |
| *B29C 55/04* | (2006.01) |

(52) U.S. Cl.
CPC ............ *D04H 3/045* (2013.01); *D04H 13/02* (2013.01); *G09F 3/0292* (2013.01)

(56) References Cited

U.S. PATENT DOCUMENTS

| | | |
|---|---|---|
| 5,316,838 A | 5/1994 | Crandall |
| 2011/0085749 A1 | 4/2011 | Frei et al. |
| 2012/0322638 A1 | 12/2012 | Seber |
| 2013/0137805 A1 | 5/2013 | Salomons |

OTHER PUBLICATIONS

International Search Report and Written Opinion of the International Searching Authority, International Application No. PCT/US2017/029018, 10 pages, dated Jun. 26, 2017.

International Search Report and Written Opinion of the International Searching Authority, International Application No. PCT/US2017/057026, 10 pages, dated Dec. 22, 2017.

__US 10,597,196 B2__

TAMPER-EVIDENT MESH MATERIAL AND METHODS OF MANUFACTURE THEREFOR

PRIORITY CLAIM

The present application is a continuation-in-part of, and, to the fullest extent permitted by law, claims priority to and the full benefit of, U.S. Non-Provisional patent application Ser. No. 15/494,471, filed on Apr. 22, 2017, and entitled "Tamper-Evident Mesh Material and Methods of Manufacture Therefor", which, to the fullest extent permitted by law, claims priority to and the full benefit of U.S. Provisional Patent Application No. 62/326,683, filed on Apr. 22, 2016, and entitled "Tamper-Evident Mesh Material and Methods of Manufacture Therefor", all of which are incorporated herein by reference in their entireties.

FIELD OF THE INVENTION

The present invention relates generally to tamper-evident material and, more specifically, to tamper-evident mesh material, methods of manufacture therefor, and tamper-evident bags manufactured therefrom.

BACKGROUND OF THE INVENTION

Tamper-evident security bags manufactured from woven or nonwoven fabrics are known. Such security bags, however, suffer a shortcoming in that the strands of the woven or nonwoven fabric may be displaced, without detection, and thereby allow the unauthorized access to the contents of the bag.

Therefore, a need exists for a tamper-evident mesh material for use in the manufacture of tamper-evident security bags, in which the displacement of any strands of the mesh material can be detected, the presence of which indicates that the bag and the contents thereof had been tampered with or otherwise accessed without authorization.

SUMMARY OF THE INVENTION

The present invention is directed to tamper-evident mesh material, methods of manufacture therefor, and tamper-evident bags manufactured therefrom. The tamper-evident mesh material of the present invention may be used, for example, in the manufacture of a variety of tamper-evident security bags for use in applications where it is desirable to detect any traces or evidence of tampering with, or of unauthorized access to, the contents of the bag. Examples of such tamper-evident security bags include currency bags or transaction bags.

The tamper-evident mesh material of the present invention is formed from a nonwoven mesh fabric comprising a contrast layer disposed thereover. The nonwoven mesh fabric comprises a first plurality of strands and a second plurality of strands, wherein the first plurality of strands is oriented in a direction different from the second plurality of strands, and wherein the first plurality of strands is disposed over and bonded to the second plurality of strands at a plurality of crossover points, i.e., points where overlying strands of the first plurality of strands cross over and contact underlying strands of the second plurality of strands. Stated differently, the nonwoven mesh fabric comprises a plurality of strands oriented in a first direction (first direction (or FD) strands (each strand thereof, an FD strand)) disposed over a plurality of strands oriented in a second direction (second direction (or SD) strands (each strand thereof, an SD strand)), and wherein the FD strands are bonded to the SD strands at a plurality of crossover points, i.e., where the FD strands cross over and contact the underlying SD strands. Each strand of the first plurality of strands (or each FD strand) may be discrete strands, may be interconnected with one or more strands, may be integrally formed with one or more strands, or may otherwise comprise one or more strands branching therefrom. Similarly, each strand of the second plurality of strands (or each SD strand) may be discrete strands, may be interconnected with one or more strands, may be integrally formed with one or more strands, or may otherwise comprise one or more strands branching therefrom.

Each strand of the first and/or second plurality of strands of the nonwoven mesh fabric: may be pigmented (meaning that each strand of the first and/or second plurality of strands comprises added pigment(s)); may be unpigmented (or non pigmented) (meaning that each strand of the first and/or second plurality of strands comprises no added pigment(s), and may be transparent, semi-transparent, semi-opaque or opaque based on the selected polymeric composition(s) of the first and/or second plurality of strands); or may otherwise comprise color(s) (meaning that each strand of the first and/or second plurality of strands comprises color(s) attributable to the selected polymeric composition(s) of the first and/or second plurality of strands). The pigmentation, non-pigmentation or color(s) of the strands of the first and/or second plurality of strands constitute visual properties thereof. In one embodiment of the present invention, each strand of the first and second plurality of strands is pigmented. In another embodiment of the present invention, each strand of the first and second plurality of strands is pigmented, wherein the pigmentation of each of the strands of the first and second plurality of strands is (or may optionally be) the same or substantially the same in color. In yet another embodiment of the present invention, each strand of the first plurality of strands is pigmented a first color, and each strand of the second plurality of strands is pigmented a second color, wherein the first color is different in color from the second color of the respective strands of the first and second plurality of strands. In still another embodiment of the present invention, each strand of the first plurality of strands is unpigmented, and each strand of the second plurality of strands is pigmented (or vice versa). In a further embodiment of the present invention, each strand of the first and second plurality of strands is unpigmented. In still a further embodiment of the present invention, each strand of the first and second plurality of strands comprises color(s), wherein the color(s) of each of the strands of the first and second plurality of strands is/are (or may optionally be) the same, substantially the same, or different. In yet a further embodiment of the present invention, each strand of the first plurality of strands is pigmented, and each strand of the second plurality of strands comprises color(s) (or vice versa). In still yet a further embodiment of the present invention, each strand of the first plurality of strands is unpigmented, and each strand of the second plurality of strands comprises color(s) (or vice versa).

At least one surface of each strand of the first and second plurality of strands is covered with a contrast layer that is visually distinct from the pigmentation or non-pigmentation or color(s), as applicable, of each of the strands of the first and second plurality of strands (or visually distinct from the pigmentation or non-pigmentation or color(s), as applicable, of at least each of the strands of the second plurality of strands). The contrast layer may be, for example, a metal layer, a printed layer or a coating. Specifically, the contrast layer may be disposed over, for example, the front surface of each strand of the first and second plurality of strands to conceal the pigmentation or non-pigmentation or color(s) (i.e., the visual property), as applicable, of those front surfaces; however, sections on the front surface of the underlying strands of the second plurality of strands over which the overlying strands of the first plurality of strands are bonded (namely, at the plurality of crossover points) do not include the contrast layer, as those sections were shielded during application of the contrast layer by sections of the overlying strands of the first plurality of strands bonded thereover. Breakage of the bond, and thus disruption of the contrast layer, at a crossover point of an overlying strand and an underlying strand of the respective first and second plurality of strands (via displacement of either the overlying or underlying strand) exposes the pigmented or non-pigmented or colored (as applicable) section (and thus the visual property) of the underlying strand at that particular crossover point, i.e., the pigmented or non-pigmented or colored (as applicable) section on the front surface of the underlying strand to which the overlying strand had been previously bonded. In a tamper-evident security bag formed from the tamper-evident mesh material of the present invention, the visibility of that pigmented or non-pigmented or colored (as applicable) section on that underlying strand would serve as an indicator that the bag and the contents thereof had been tampered with or otherwise accessed without authorization.

In one embodiment of the present invention, the tamper-evident mesh material is formed from a metalized, pigmented nonwoven mesh fabric. The nonwoven mesh fabric comprises a first plurality of strands and a second plurality of strands, wherein each strand of the first and second plurality of strands is pigmented, and wherein the first plurality of strands is oriented in a direction different from the second plurality of strands. The first plurality of strands is disposed over and thermally bonded to the second plurality of strands at a plurality of crossover points, i.e., where the first plurality of strands crosses over and contacts the second plurality of strands. At least one surface of each strand of the first and second plurality of strands is metalized. Specifically, a metal layer is disposed over, for example, the front surface of each strand of the first and second plurality of strands to conceal the pigmentation of those front surfaces; however, sections on the front surface of the strands of the second plurality of strands over which the strands of the first plurality of strands are thermally bonded (namely, at the plurality of crossover points) are not metalized, as those sections on the front surface of those strands of the second plurality of strands were shielded during the metallization process by sections of strands of the first plurality of strands thermally bonded thereover. Breakage of the thermal bond, and thus disruption of the metal layer, at a crossover point of an overlying strand and an underlying strand, respectively, of the first and second plurality of strands (via displacement of either the overlying or underlying strand) exposes the pigmented, non-metalized section of the underlying strand at that particular crossover point, i.e., the pigmented section on the front surface of that underlying strand over which the overlying strand had been previously thermally bonded. In a tamper-evident security bag formed from the tamper-evident mesh material of the present invention, the visibility of that pigmented, non-metalized section on that underlying strand would serve as an indicator that the bag and the contents thereof had been tampered with or otherwise accessed without authorization.

In another embodiment of the present invention, the tamper-evident mesh material is formed from a metalized, nonwoven mesh fabric. The nonwoven mesh fabric comprises a first plurality of strands and a second plurality of strands, wherein the first plurality of strands is oriented in a direction different from the second plurality of strands, and wherein the first plurality of strands is disposed over and thermally bonded to the second plurality of strands at a plurality of crossover points, i.e., where the first plurality of strands crosses over and contacts the second plurality of strands. Each strand of the first plurality of strands is unpigmented, and each strand of the second plurality of strands is pigmented. At least one surface of each strand of the first and second plurality of strands is metalized. Specifically, a metal layer is disposed over, for example, the front surface of each strand of the first and second plurality of strands to conceal the non-pigmentation and the pigmentation of those front surfaces, respectively, of each of the strands of the first and second plurality of strands; however, sections on the front surface of the strands of the second plurality of strands over which the strands of the first plurality of strands are thermally bonded (namely, at the plurality of crossover points) are not metalized, as those sections on the front surface of those strands of the second plurality of strands were shielded during the metallization process by sections of strands of the first plurality of strands thermally bonded thereover. Breakage of the thermal bond, and thus disruption of the metal layer, at a crossover point of an overlying strand and an underlying strand, respectively, of the first and second plurality of strands (via displacement of either the overlying or underlying strand) exposes the pigmented, non-metalized section of the underlying strand at that particular crossover point, i.e., the pigmented section on the front surface of that underlying strand over which the overlying strand had been previously thermally bonded. In a tamper-evident security bag formed from the tamper-evident mesh material of the present invention, the visibility of that pigmented, non-metalized section on that underlying strand would serve as an indicator that the bag and the contents thereof had been tampered with or otherwise accessed without authorization.

Additionally, a tamper-evident security bag formed from a tamper-evident mesh material of the present invention may serve to reduce or avoid the potential for "false positives"; that is, the potential for an inaccurate assessment that the bag and the contents thereof had suffered from tampering. By way of example but not limitation, in one embodiment of the present invention, a tamper-evident security bag, in which false positives may be reduced or avoided, may be formed from a tamper-evident mesh material wherein each strand of the first plurality of strands of the nonwoven mesh fabric is pigmented a first color, and each strand of the second plurality of strands of the nonwoven mesh fabric is pigmented a second color, and wherein the first color is different in color from the second color of the respective strands of the first and second plurality of strands. In the event any use, transport or other handling of such a tamper-evident security bag causes the contrast layer to abrade from, for example, the front surface of an overlying strand (of the first plurality of strands) at a crossover point of that overlying strand and an underlying strand (of the second plurality of strands), a pigmented section (or the first color) of the overlying strand (from where the contrast layer had been abraded) would be exposed. And, because the pigmentation (or first color) of each strand of the first plurality of strands is different in color from the pigmentation (or second color) of each strand of the second plurality of strands, visibility of that pigmented section (or first color) on that overlying strand and not the pigmented section (or second color) of the underlying strand (i.e., at that particular crossover point, and where the overlying strand remains bonded to the underlying strand) may serve to indicate that only the contrast layer had abraded from the front surface of the overlying strand (at that particular crossover point), that the overlying or underlying strands had not been displaced (at that particular crossover point), and that, thus, the bag and the contents thereof had not suffered from tampering (at least at that particular crossover point).

By way of further example but not limitation, in another embodiment of the present invention, a tamper-evident security bag, in which false positives may be reduced or avoided, may be formed from a tamper-evident mesh material wherein each strand of the first plurality of strands of the nonwoven mesh fabric is unpigmented, and each strand of the second plurality of strands of the nonwoven mesh fabric is pigmented. Here too, in the event any use, transport or other handling of such a tamper-evident security bag causes the contrast layer to abrade from, for example, the front surface of an overlying strand (of the first plurality of strands) at a crossover point of that overlying strand and an underlying strand (of the second plurality of strands), an unpigmented section of the overlying strand (from where the contrast layer had been abraded) would be exposed. And, because each strand of the first plurality of strands, without pigmentation, may be transparent or semi-transparent (by virtue of the selected polymeric composition(s) of the first plurality of strands), a pigmented section of the underlying strand would then be visible through the exposed (and transparent or semi-transparent) unpigmented section of the overlying strand (i.e., at that particular crossover point, and where the overlying strand remains bonded to the underlying strand). Visibility of that pigmented section on that underlying strand (through the exposed (and transparent or semi-transparent) unpigmented section of the overlying strand bonded thereover) may serve to indicate that only the contrast layer had abraded from the front surface of the overlying strand (at that particular crossover point), that the overlying or underlying strands had not been displaced (at that particular crossover point), and that, thus, the bag and the contents thereof had not suffered from tampering (at least at that particular crossover point).

The tamper-evident mesh material of the present invention may be used in the manufacture of a tamper-evident security bag, pouch or other packaging, including a bag having one side formed from film and the other side formed from the tamper-evident mesh material of the present invention, or a bag having film sides with one or more windows formed from the tamper-evident mesh material of the present invention, or a bag in which both sides are formed from the tamper-evident mesh material of the present invention and which bag may include one or more film sections.

These and other features and advantages of the present invention will become apparent to those of ordinary skill in the art after reading the following Detailed Description of the Invention.

BRIEF DESCRIPTION OF THE DRAWINGS

The accompanying drawings, which are incorporated in and constitute a part of this specification, illustrate various embodiments of the present invention and, together with the general description of the invention given above, and the detailed description of the embodiments given below, serve to explain the embodiments of the invention.

DETAILED DESCRIPTION OF THE INVENTION

Figure 1:
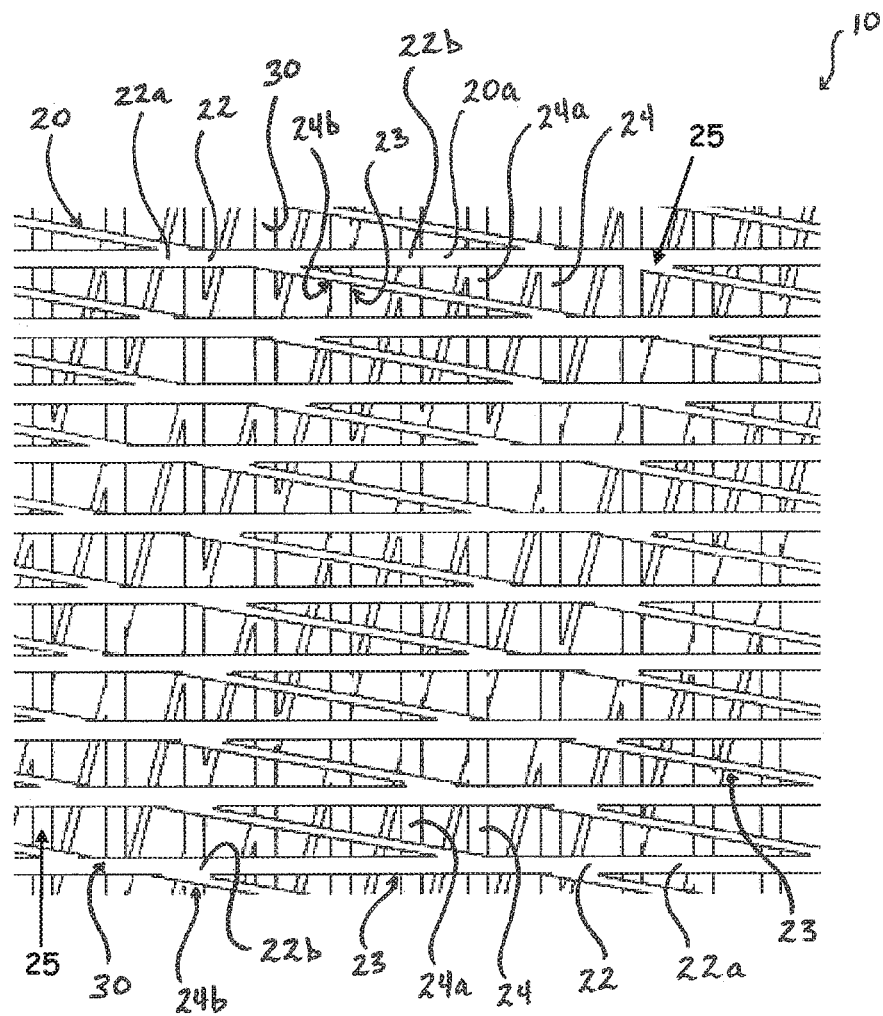
FIG. 1 is a plan view of a tamper-evident mesh material according to an embodiment of the present invention, showing no displacement of the FD and SD strands thereof.
Figure 2:
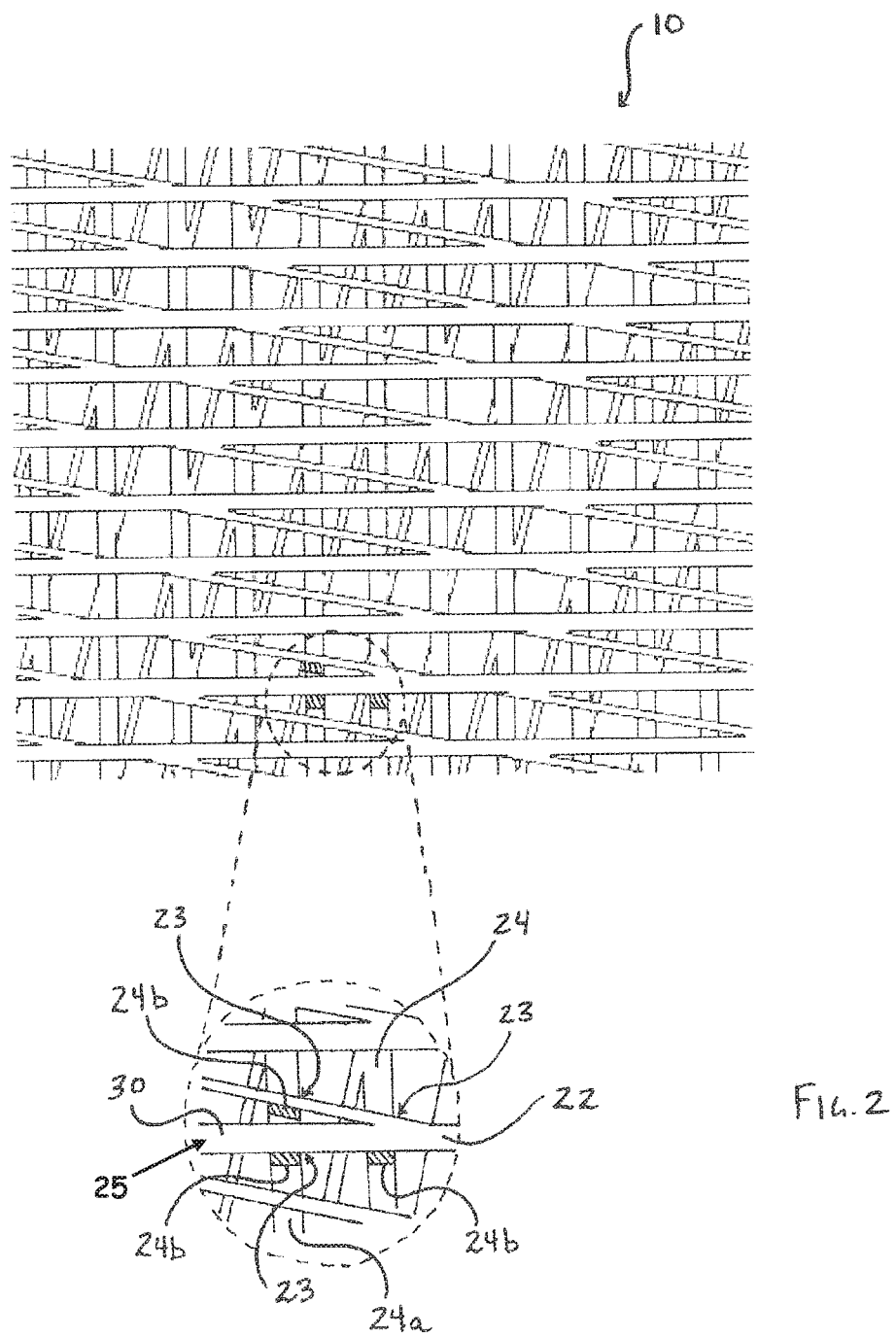
FIG. 2 is a plan view of the tamper-evident mesh material of FIG. 1, showing a magnified view of the displacement of certain of the FD and SD strands thereof.
Figure 3:
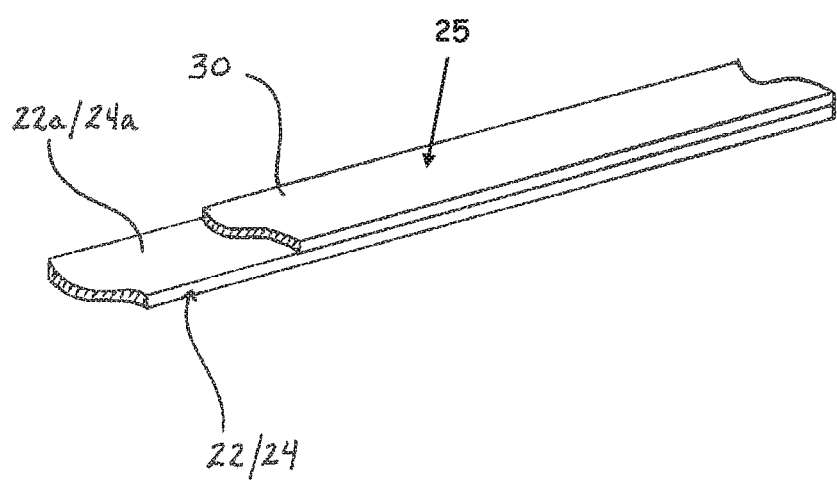
FIG. 3 is a cross-sectional perspective view of a portion of either a FD or SD strand of the tamper-evident mesh material of FIG. 1.
Figure 4:
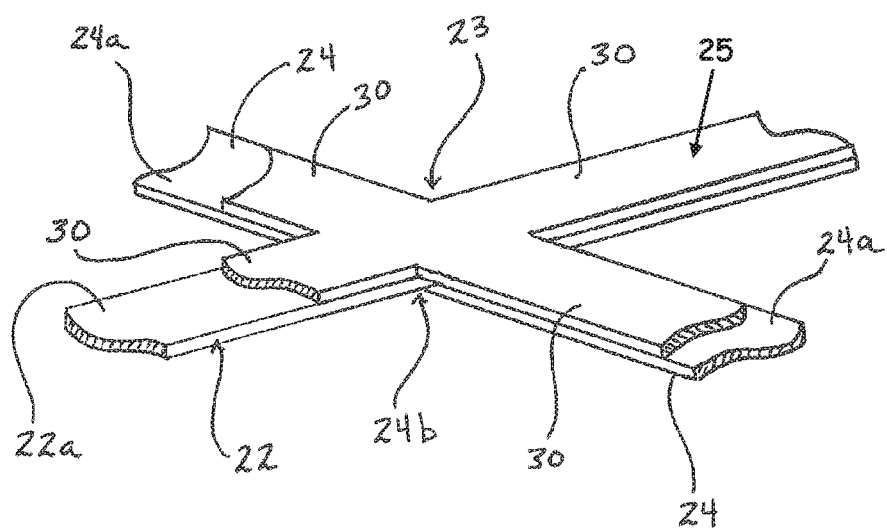
FIG. 4 is a cross-sectional perspective view of portions of FD and SD strands of the tamper-evident mesh material of FIG. 1, showing no displacement of the FD and SD strands.
Figure 5:
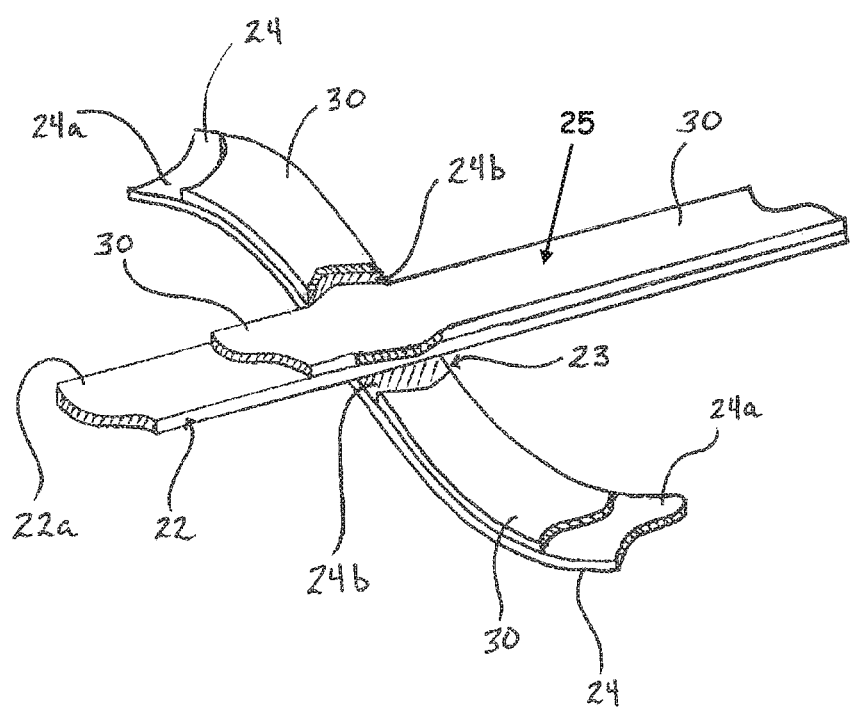
FIG. 5 is a cross-sectional perspective view of the portions of FD and SD strands of the tamper-evident mesh material of FIG. 4, showing displacement of the FD and SD strands.
Figure 6:
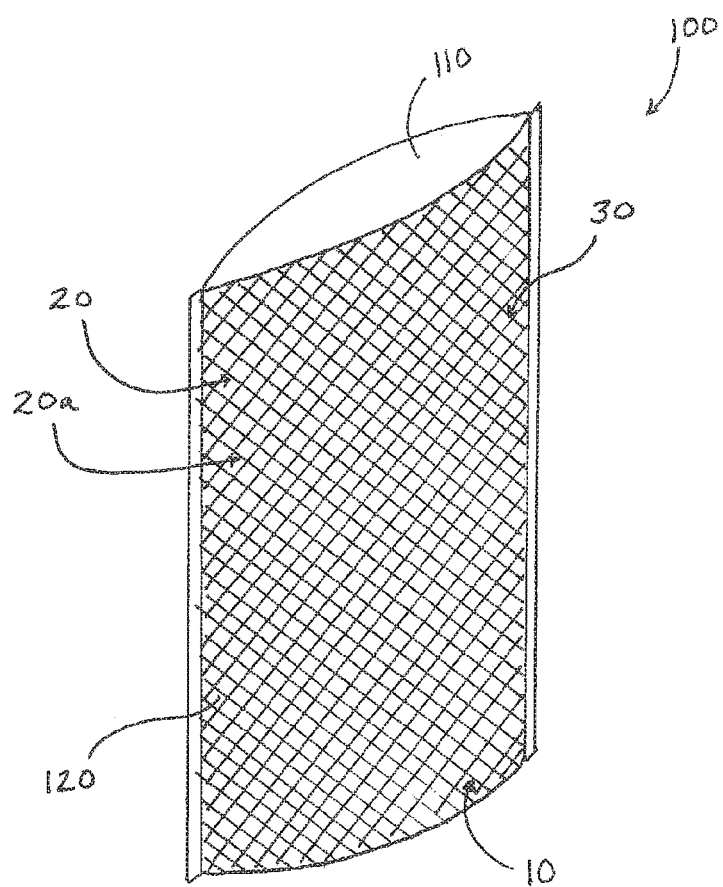
FIG. 6 is a perspective view of a tamper-evident security bag manufactured from the tamper-evident mesh material of FIG. 1.
Figure 7:
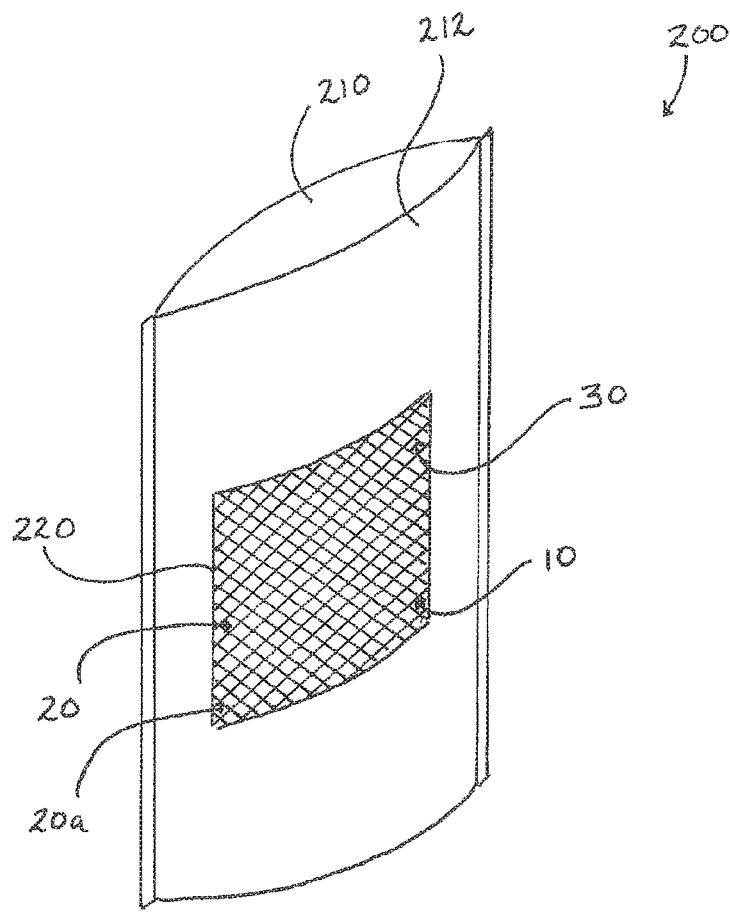
FIG. 7 is a perspective view of a tamper-evident security bag manufactured from the tamper-evident mesh material of FIG. 1.
Figure 8:
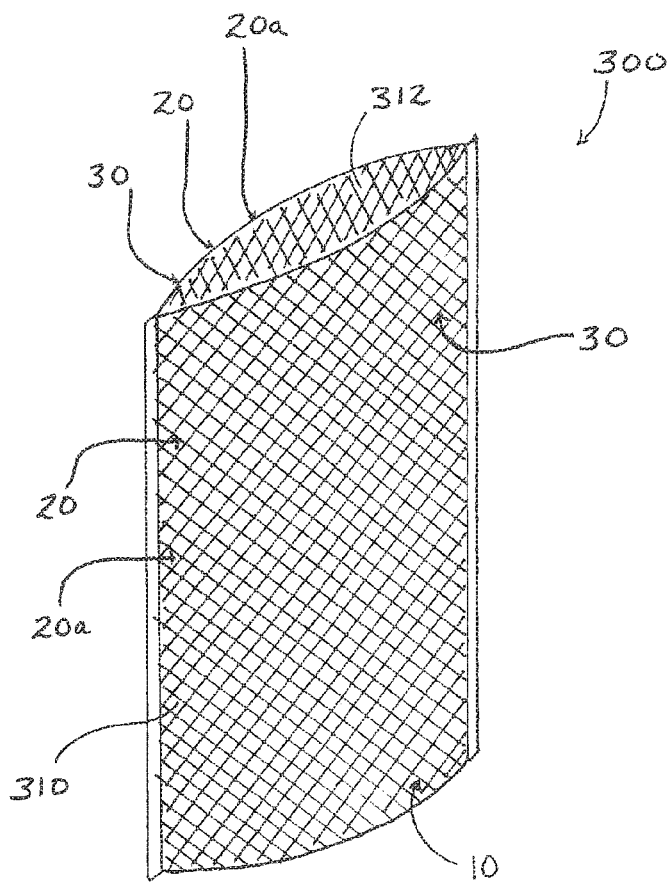
FIG. 8 is a perspective view of a tamper-evident security bag manufactured from the tamper-evident mesh material of FIG. 1.
Figure 9:
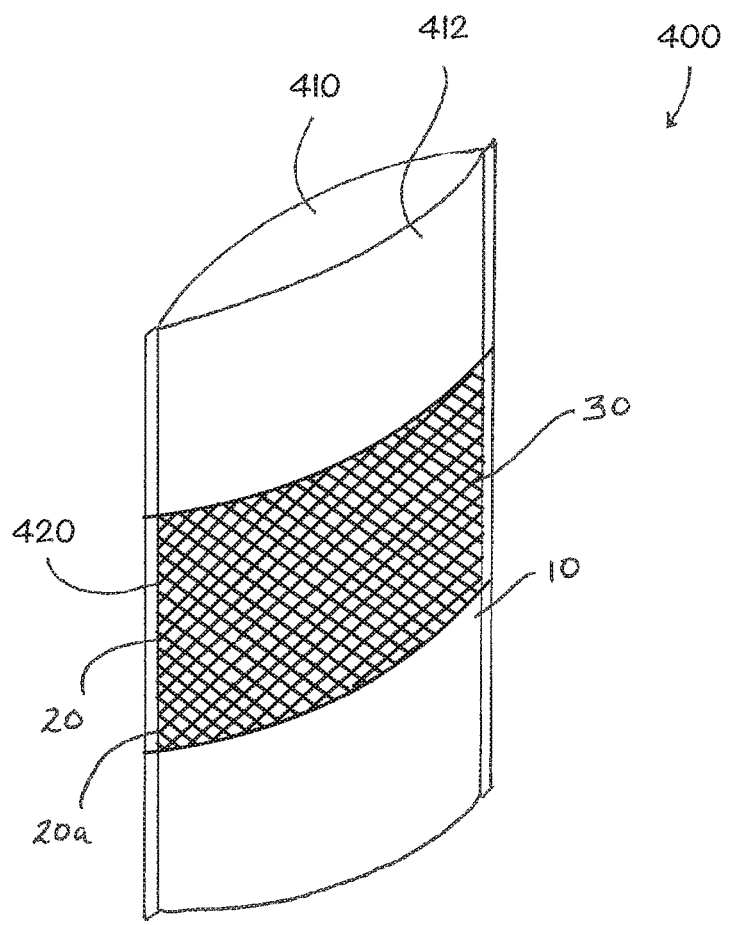
FIG. 9 is a perspective view of a tamper-evident security bag manufactured from the tamper-evident mesh material of FIG. 1.
Figure 10:
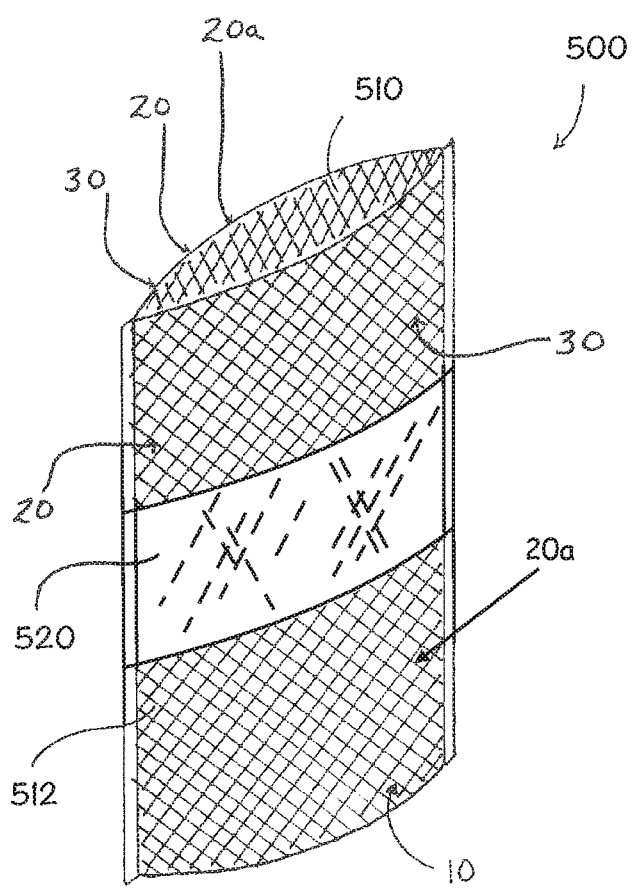
FIG. 10 is a perspective view of a tamper-evident security bag manufactured from the tamper-evident mesh material of FIG. 1.
Figure 11:
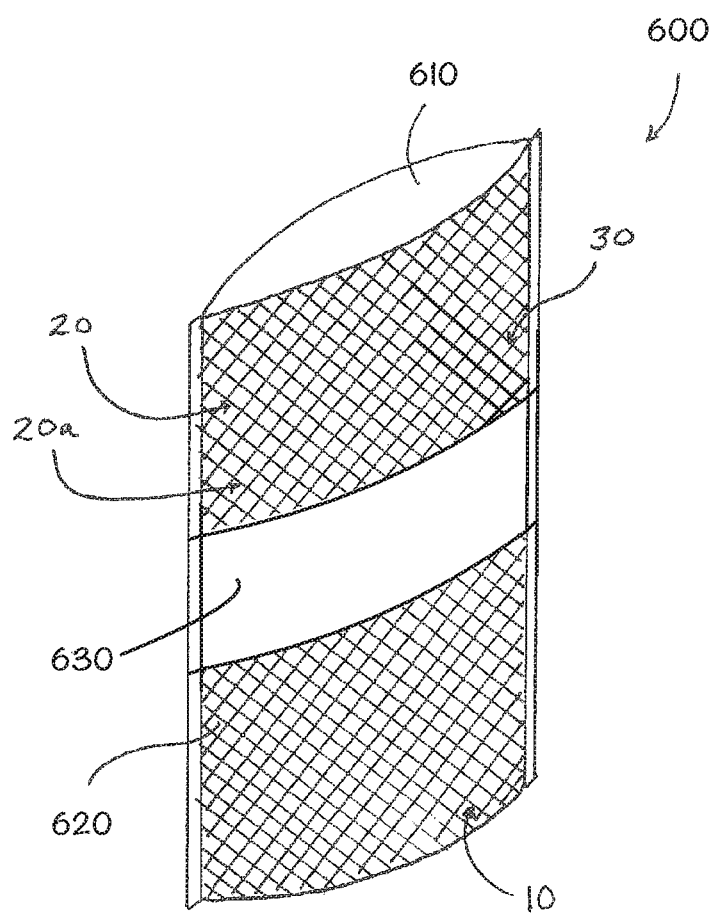
FIG. 11 is a perspective view of a tamper-evident security bag manufactured from the tamper-evident mesh material of FIG. 1.

For simplicity and illustrative purposes, the principles of the present invention are described by referring to various exemplary embodiments thereof, and which embodiments may be depicted in FIGS. 1-13. The present invention is not limited to the particular examples, embodiments or methods described herein or otherwise depicted in the Figures, as these may vary. Additionally, the terminology used herein is used for the purpose of describing particular embodiments only, and is not intended to limit the scope of the present invention. Unless defined otherwise, all technical and scientific terms used herein have the same meanings as commonly understood by one of ordinary skill in the art to which this invention belongs. Specific methods and materials are described, although other methods and materials similar or equivalent to those described herein may be used in the practice of the present invention. Moreover, although certain methods may be described with reference to certain steps that are presented herein in a certain order, in many instances, these steps may be performed in any order as would be appreciated by one of ordinary skill in the art, and thus the methods are not limited to the particular arrangement of steps disclosed herein.

Referring now to FIGS. 1-5, in one embodiment of the present invention, tamper-evident mesh material 10 is formed from a nonwoven mesh fabric 20 comprising a contrast layer 25 disposed thereover. Mesh fabric 20 comprises a plurality of strands oriented in a first direction (first direction (or FD) strands 22 (each strand thereof, an FD strand 22)) disposed over a plurality of strands oriented in a second direction (second direction (or SD) strands 24 (each strand thereof, an SD strand 24)). FD strands 22 may be, for example, a plurality of strands generally oriented in the cross machine direction (cross machine direction (or CD) strands), and SD strands 24 may be, for example, a plurality of strands generally oriented in the machine direction (machine direction (or MD) strands), or vice versa. Additionally, each FD strand 22 may be discrete strands, may be interconnected with one or more FD strands 22, may be integrally formed with one or more FD strands 22, or may otherwise comprise one or more FD strands 22 branching therefrom. Similarly, each SD strand 24 may be discrete strands, may be interconnected with one or more SD strands 24, may be integrally formed with one or more SD strands 24, or may otherwise comprises one or more SD strands 24 branching therefrom. FD strands 22 are thermally bonded (e.g., via calendaring, through-air, infrared or ultrasonic) (or, alternatively, chemically bonded (e.g., via solvents or binders), or adhesively bonded (e.g., via acrylic or polyolefin adhesives)) to SD strands 24 at substantially each of crossover points 23, i.e., at substantially each point where the FD strands 22 cross over and contact the underlying SD strands 24. (As used herein, the term "substantially", when made with reference to thermal bonding (or any alternate bonding) at "each of crossover points 23", is intended to allow for conventional levels of bonding imperfections and defects in otherwise uniformly oriented and bonded nonwoven fabrics.).

FD strands 22 and/or SD strands 24 may be pigmented (meaning that FD strands 22 and/or SD strands 24 comprise added pigment(s)), or may be unpigmented (or non-pigmented) (meaning that FD strands 22 and/or SD strands 24 comprise no added pigment(s), and may be transparent, semi-transparent, semi-opaque or opaque based on the selected polymeric composition(s) of FD strands 22 and/or SD strands 24, as applicable), or may otherwise comprise color(s) (meaning that FD strands 22 and/or SD strands 24 comprise color(s) attributable to the selected polymeric composition(s) of FD strands 22 and/or SD strands 24, as applicable). The pigmentation, non-pigmentation or color(s), as applicable, of FD strands 22 and SD strands 24 constitute a visual property of FD strands 22 and SD strands 24. In one embodiment of the present invention, FD strands 22 and SD strands 24 are pigmented. In another embodiment of the present invention, FD strands 22 and SD strands 24 are pigmented, wherein the pigmentation of FD strands 22 and SD strands 24 is (or may optionally be) the same or substantially the same in color. In yet another embodiment of the present invention, FD strands 22 are pigmented a first color, and SD strands 24 are pigmented a second color, wherein the first color is different in color from the second color of the respective FD strands 22 and SD strands 24. In still another embodiment of the present invention, FD strands 22 are unpigmented, and SD strands 24 are pigmented (or vice versa). In a further embodiment of the present invention, FD strands 22 and SD strands 24 are unpigmented. In still a further embodiment of the present invention, FD strands 22 and SD strands 24 comprise color(s), wherein the color(s) of FD strands 22 and SD strands 24 are (or may optionally be) the same, substantially the same, or different. In yet a further embodiment of the present invention, FD strands 22 are pigmented, and SD strands 24 comprise color(s) (or vice versa). In still yet a further embodiment of the present invention, FD strands 22 are unpigmented, and SD strands 24 comprise color(s) (or vice versa).

Figure 12:
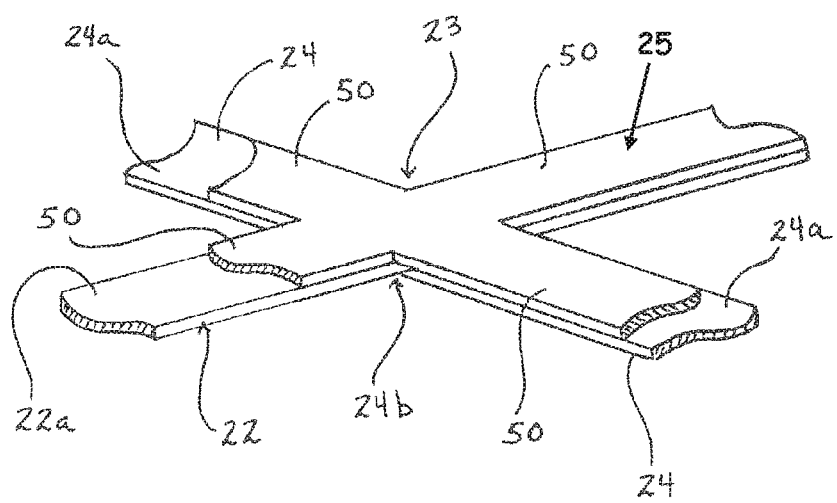
FIG. 12 is a cross-sectional perspective view of portions of FD and SD strands of a tamper-evident mesh material according to an embodiment of the present invention, showing no displacement of the FD and SD strands.
Figure 13:
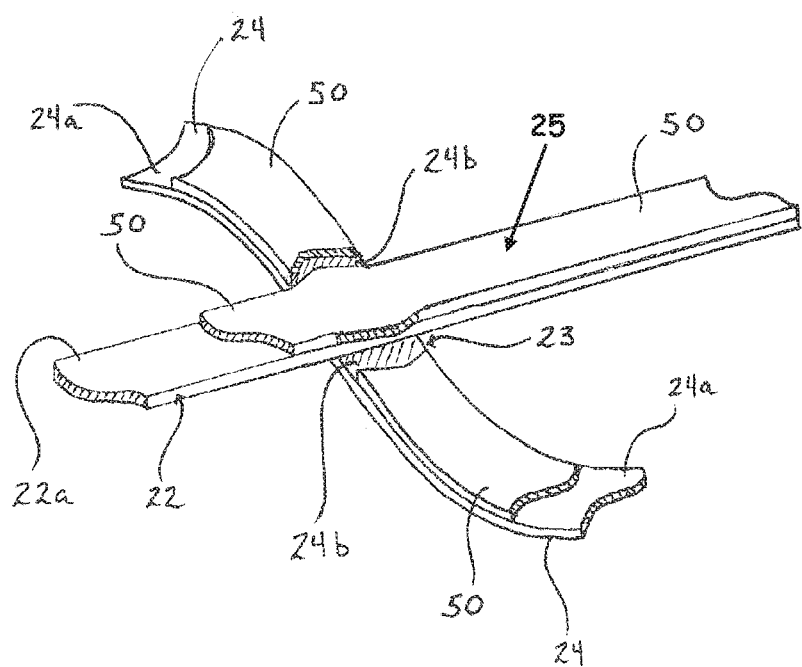
FIG. 13 is a cross-sectional perspective view of the portions of FD and SD strands of the tamper-evident mesh material of FIG. 12, showing displacement of the FD and SD strands.

Contrast layer 25 may be, for example, a metal layer 30 (as described herein with reference to FIGS. 1-11) or a printed layer or a coating (as described herein with reference to FIGS. 12 and 13). Contrast layer 25 is disposed over at least a portion of one or more surfaces of each FD strand 22 and each SD strand 24, and serves to conceal the pigmentation, non-pigmentation or color(s) (i.e., the visual property), as applicable, of those portions of the one or more surfaces of FD strands 22 and SD strands 24 over which contrast layer 25 is disposed. For example, contrast layer 25 may be disposed over at least the front surfaces 22a, 24a, respectively, of FD and SD strands 22, 24; however, sections 24b on the front surface 24a of each SD strand 24 over which FD strands 22 are thermally bonded (namely, at substantially each of crossover points 23) would not include contrast layer 25, as those sections 24b would have been shielded during application of contrast layer 25 by the sections 22b of FD strands 22 thermally bonded thereover (see, FIGS. 1, 4, 12). Consequently, breakage of the thermal bond, and thus disruption of contrast layer 25, at a crossover point 23 of any selected FD strand 22 and SD strand 24 (via displacement of those FD or SD strands 22, 24) would expose the pigmented or non-pigmented or colored (as applicable) section 24b (and thus the visual property) of the SD strand 24 at that particular crossover point 23, i.e., the pigmented or non-pigmented or colored (as applicable) section 24b on the front surface 24a of the SD strand 24 over which the FD strand 22 had been previously thermally bonded (see, FIGS. 2, 5, 13). In a tamper-evident security bag formed from the tamper-evident mesh material of the present invention, the visibility of this pigmented or non-pigmented or colored (as applicable) section 24b of SD strand 24 would serve as an indicator that the bag and the contents thereof had been tampered with or otherwise accessed without authorization.

In various embodiments, contrast layer 25 is or may be visually distinct from the pigmentation, non-pigmentation or color(s), as applicable, of FD strands 22 and SD strands 24. For example, in an embodiment where FD strands 22 and SD strands 24 are pigmented (including where the pigmentation of FD strands 22 and SD strands 24 is the same or substantially the same in color), contrast layer 25 would be visually distinct from the pigmentation of FD strands 22 and SD strands 24 (or at least visually distinct from the pigmentation of SD strands 24), and would serve to conceal the pigmentation of the one or more surfaces of FD strands 22 and SD strands 24 over which contrast layer 25 is disposed. Similarly, in an embodiment where FD strands 22 are pigmented a first color and SD strands 24 are pigmented a second color (and wherein the first color is different in color from the second color of the respective FD strands 22 and SD strands 24), contrast layer 25 would be visually distinct from the pigmentation (or first color) of FD strands 22 and the pigmentation (or second color) of SD strands 24 (or at least visually distinct from the pigmentation (or second color) of SD strands 24), and would serve to conceal the pigmentation (both the first and second colors) of the one or more surfaces of FD strands 22 and SD strands 24 over which contrast layer 25 is disposed.

In an embodiment where FD strands 22 are non-pigmented (and are transparent or semi-transparent based on the selected polymeric composition(s) of FD strands 22) and SD strands 24 are pigmented, contrast layer 25 would be visually distinct from the non-pigmented FD strands 22 and from the pigmented SD strands 24, and would serve to conceal the non-pigmentation and the pigmentation of the one or more surfaces of respective FD strands 22 and SD strands 24 over which contrast layer 25 is disposed. In an embodiment where FD strands 22 are non-pigmented (and are opaque or semi-opaque based on the selected polymeric composition(s) of FD strands 22) and SD strands 24 are pigmented, contrast layer 25 would be visually distinct from the non-pigmented FD strands 22 and from the pigmented SD strands 24 (or at least visually distinct from the pigmentation of SD strands 24), and would serve to conceal the non-pigmentation and the pigmentation of the one or more surfaces of respective FD strands 22 and SD strands 24 over which contrast layer 25 is disposed.

In an embodiment where FD strands 22 are pigmented and SD strands 24 are non-pigmented (and are transparent or semi-transparent based on the selected polymeric composition(s) of SD strands 24), contrast layer 25 would be visually distinct from the pigmented FD strands 22 and from the non-pigmented SD strands 24 (or at least visually distinct from the non-pigmentation of SD strands 24), and would serve to conceal the pigmentation and the non-pigmentation of the one or more surfaces of respective FD strands 22 and SD strands 24 over which contrast layer 25 is disposed. In an embodiment where FD strands 22 are pigmented and SD strands 24 are non-pigmented (and are opaque or semi-opaque based on the selected polymeric composition(s) of SD strands 24), contrast layer 25 would be visually distinct from the pigmented FD strands 22 and from the non-pigmented SD strands 24 (or at least visually distinct from the non-pigmentation of SD strands 24), and would serve to conceal the pigmentation and the non-pigmentation of the one or more surfaces of respective FD strands 22 and SD strands 24 over which contrast layer 25 is disposed.

In an embodiment where FD strands 22 and SD strands 24 comprise color(s) (including where the color(s) of FD strands 22 and SD strands 24 is/are the same, substantially the same, or different), contrast layer 25 would be visually distinct from the color(s) of FD strands 22 and SD strands 24 (or at least visually distinct from the color(s) of SD strands 24), and would serve to conceal the color(s) of the one or more surfaces of FD strands 22 and SD strands 24 over which contrast layer 25 is disposed. In an embodiment where FD strands 22 are pigmented, and SD strands 24 comprise color(s), contrast layer 25 would be visually distinct from the pigmentation of FD strands 22 and the color(s) of SD strands 24 (or at least visually distinct from the color(s) of SD strands 24), and would serve to conceal the pigmentation and the color(s) of the one or more surfaces of the respective FD strands 22 and SD strands 24 over which contrast layer 25 is disposed. In an embodiment where FD strands 22 comprise color(s), and SD strands 24 are pigmented, contrast layer 25 would be visually distinct from the color(s) of FD strands 22 and the pigmentation of SD strands 24 (or at least visually distinct from the pigmentation of SD strands 24), and would serve to conceal the color(s) and the pigmentation of the one or more surfaces of the respective FD strands 22 and SD strands 24 over which contrast layer 25 is disposed.

In an embodiment where FD strands 22 are non-pigmented (and are transparent or semi-transparent based on the selected polymeric composition(s) of FD strands 22), and SD strands 24 comprise color(s), contrast layer 25 would be visually distinct from the non-pigmentation of FD strands 22 and the color(s) of SD strands 24, and would serve to conceal the non-pigmentation and the color(s) of the one or more surfaces of respective FD strands 22 and SD strands 24 over which contrast layer 25 is disposed. In an embodiment where FD strands 22 are non-pigmented (and are opaque or semi-opaque based on the selected polymeric composition(s) of FD strands 22), and SD strands 24 comprise color(s), contrast layer 25 would be visually distinct from the non-pigmentation of FD strands 22 and the color(s) of SD strands 24 (or at least visually distinct from the color(s) of SD strands 24), and would serve to conceal the non-pigmentation and the color(s) of the one or more surfaces of respective FD strands 22 and SD strands 24 over which contrast layer 25 is disposed.

In an embodiment where FD strands 22 comprise color(s), and SD strands 24 are non-pigmented (and are transparent or semi-transparent based on the selected polymeric composition(s) of SD strands 24), contrast layer 25 would be visually distinct from the color(s) of FD strands 22 and the non-pigmentation of SD strands 24 (or at least visually distinct from the non-pigmentation of SD strands 24), and would serve to conceal the color(s) and the non-pigmentation of the one or more surfaces of respective FD strands 22 and SD strands 24 over which contrast layer 25 is disposed. In an embodiment where FD strands 22 comprise color(s), and SD strands 24 are non-pigmented (and are opaque or semi-opaque based on the selected polymeric composition(s) of SD strands 24), contrast layer 25 would be visually distinct from the color(s) of FD strands 22 and the non-pigmentation of SD strands 24 (or at least visually distinct from the non-pigmentation of SD strands 24), and would serve to conceal the color(s) and the non-pigmentation of the one or more surfaces of respective FD strands 22 and SD strands 24 over which contrast layer 25 is disposed.

In an embodiment where FD strands 22 are non-pigmented (and are transparent or semi-transparent based on the selected polymeric composition(s) of FD strands 22), and SD strands 24 are non-pigmented (and are opaque or semi-opaque based on the selected polymeric composition(s) of SD strands 24), contrast layer 25 would be visually distinct from the non-pigmentation of FD strands 22 and SD strands 24, and would serve to conceal the non-pigmentation of the one or more surfaces of FD strands 22 and SD strands 24 over which contrast layer 25 is disposed. In an embodiment where FD strands 22 are non-pigmented (and are opaque or semi-opaque based on the selected polymeric composition(s) of FD strands 22), and SD strands 24 are non-pigmented (and are transparent or semi-transparent based on the selected polymeric composition(s) of SD strands 24), contrast layer 25 would be visually distinct from the non-pigmentation of FD strands 22 and SD strands 24 (or at least visually distinct from the non-pigmentation of SD strands 24), and would serve to conceal the non-pigmentation of the one or more surfaces of FD strands 22 and SD strands 24 over which contrast layer 25 is disposed. In an embodiment where FD strands 22 and SD strands 24 are non-pigmented (and are opaque or semi-opaque based on the selected polymeric composition(s) of FD strands 22 and SD strands 24), contrast layer 25 would be visually distinct from the non-pigmentation of FD strands 22 and SD strands 24 (or at least visually distinct from the non-pigmentation of SD strands 24), and would serve to conceal the non-pigmentation of the one or more surfaces of FD strands 22 and SD strands 24 over which contrast layer 25 is disposed.

With continuing reference to FIGS. 1-5 (and as also shown in FIGS. 6-11), contrast layer 25 is in the form of metal layer 30. Metal layer 30, applied via a metallization process (described below), is disposed over at least the front surface 20a of mesh fabric 20; that is, at least front surface 20a of mesh fabric 20 is metalized to conceal the pigmentation, non-pigmentation or color(s), as applicable, of FD strands 22 and SD strands 24 of mesh fabric 20, and, more precisely, to conceal the pigmentation, non-pigmentation or color(s), as applicable, of the front surfaces 22a, 24a, respectively, of FD and SD strands 22, 24 (see, FIGS. 1, 3, 4). Specifically, metal layer 30 extends over the entire front surface 22a of each FD strand 22, and over the front surface 24a of each SD strand 24 except for sections 24b on the front surface 24a of each SD strand 24 over which FD strands 22 are thermally bonded (namely, at substantially each of crossover points 23) (see, FIGS. 3, 4). Stated differently, the front surface 22a of each FD strand 22 is metalized, and the front surface 24a of each SD strand 24 is also metalized; however, the sections 24b on the front surface 24a of each SD strand 24 over which FD strands 22 are thermally bonded (namely, at substantially each of crossover points 23) are not metalized, as those sections 24b were shielded during the metallization process by the sections 22b of FD strands 22 thermally bonded thereover (see, FIGS. 1, 4). Consequently, breakage of the thermal bond, and thus disruption of metal layer 30, at a crossover point 23 of the metalized FD and SD strands 22, 24 (via displacement of those metalized FD or SD strands 22, 24) exposes the pigmented or non-pigmented or colored (as applicable), non-metalized section 24b (and thus the visual property) of the SD strand 24 at that particular crossover point 23, i.e., the pigmented or non-pigmented or colored (as applicable) section 24b on the front surface 24a of the SD strand 24 over which the FD strand 22 had been previously thermally bonded (see, FIGS. 2, 5). In a tamper-evident security bag formed from the afore-described tamper-evident mesh material, where the metalized front surface 20a of mesh fabric 20 forms, at least in part, an exterior face of the security bag, the visibility of this pigmented or non-pigmented or colored (as applicable), non-metalized section 24b of SD strand 24 would serve as an indicator that the bag and the contents thereof had been tampered with or otherwise accessed without authorization.

Depending upon the pigmentation, non-pigmentation or color(s) of FD strands 22 and SD strands 24 of mesh fabric 20 of tamper-evident mesh material 10, breakage of the thermal bond, and thus disruption of metal layer 30, at a crossover point 23 of the metalized FD and SD strands 22, 24 (via displacement of those metalized FD or SD strands 22, 24) will yield different visual results. For example, in an embodiment of tamper-evident mesh material 10 where FD strands 22 and SD strands 24 are pigmented (including where the pigmentation of FD strands 22 and SD strands 24 is the same or substantially the same in color), breakage of the thermal bond, and thus disruption of metal layer 30, at a crossover point 23 of the metalized FD and SD strands 22, 24 (via displacement of those metalized FD or SD strands 22, 24) would expose the pigmented, non-metalized section 24b of the SD strand 24 at that particular crossover point 23, i.e., the pigmented section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this pigmented, non-metalized section 24b of SD strand 24 would serve as an indicator that the bag and the contents thereof had been tampered with or otherwise accessed without authorization.

Similarly, in an embodiment where FD strands 22 are pigmented a first color and SD strands 24 are pigmented a second color (and wherein the first color is different in color from the second color of the respective FD strands 22 and SD strands 24), breakage of the thermal bond, and thus disruption of metal layer 30, at a crossover point 23 of the metalized FD and SD strands 22, 24 (via displacement of those metalized FD or SD strands 22, 24) would expose the pigmented, non-metalized section 24b (and thus the second color) of the SD strand 24 at that particular crossover point 23, i.e., the pigmented section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this pigmented, non-metalized section 24b (and thus the second color) of SD strand 24 would serve as an indicator that the bag and the contents thereof had been tampered with or otherwise accessed without authorization.

In an embodiment where FD strands 22 are non-pigmented (and are transparent, semi-transparent, semi-opaque, or opaque based on the selected polymeric composition(s) of FD strands 22) and SD strands 24 are pigmented, breakage of the thermal bond, and thus disruption of metal layer 30, at a crossover point 23 of the metalized FD and SD strands 22, 24 (via displacement of those metalized FD or SD strands 22, 24) would expose the pigmented, non-metalized section 24b of the SD strand 24 at that particular crossover point 23, i.e., the pigmented section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this pigmented, non-metalized section 24b of SD strand 24 would serve as an indicator that the bag and the contents thereof had been tampered with or otherwise accessed without authorization.

In an embodiment where FD strands 22 are pigmented and SD strands 24 are non-pigmented (and are transparent, semi-transparent, semi-opaque, or opaque based on the selected polymeric composition(s) of SD strands 24), breakage of the thermal bond, and thus disruption of metal layer 30, at a crossover point 23 of the metalized FD and SD strands 22, 24 (via displacement of those metalized FD or SD strands 22, 24) would expose the non-pigmented, non-metalized section 24b of the SD strand 24 at that particular crossover point 23, i.e., the non-pigmented section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this non-pigmented, non-metalized section 24b of SD strand 24 would serve as an indicator that the bag and the contents thereof had been tampered with or otherwise accessed without authorization.

In an embodiment where FD strands 22 and SD strands 24 comprise one or more colors (including where the color(s) of FD strands 22 and SD strands 24 is/are the same, substantially the same, or different), breakage of the thermal bond, and thus disruption of metal layer 30, at a crossover point 23 of the metalized FD and SD strands 22, 24 (via displacement of those metalized FD or SD strands 22, 24) would expose the colored, non-metalized section 24b of the SD strand 24 at that particular crossover point 23, i.e., the colored section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this colored, non-metalized section 24b of SD strand 24 would serve as an indicator that the bag and the contents thereof had been tampered with or otherwise accessed without authorization.

In an embodiment where FD strands 22 are pigmented, and SD strands 24 comprise color(s), breakage of the thermal bond, and thus disruption of metal layer 30, at a crossover point 23 of the metalized FD and SD strands 22, 24 (via displacement of those metalized FD or SD strands 22, 24) would expose the colored, non-metalized section 24b of the SD strand 24 at that particular crossover point 23, i.e., the colored section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this colored, non-metalized section 24b of SD strand 24 would serve as an indicator that the bag and the contents thereof had been tampered with or otherwise accessed without authorization.

In an embodiment where FD strands 22 comprise color(s), and SD strands 24 are pigmented, breakage of the thermal bond, and thus disruption of metal layer 30, at a crossover point 23 of the metalized FD and SD strands 22, 24 (via displacement of those metalized FD or SD strands 22, 24) would expose the pigmented, non-metalized section 24b of the SD strand 24 at that particular crossover point 23, i.e., the pigmented section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this pigmented, non-metalized section 24b of SD strand 24 would serve as an indicator that the bag and the contents thereof had been tampered with or otherwise accessed without authorization.

In an embodiment where FD strands 22 are non-pigmented (and are transparent, semi-transparent, semi-opaque, or opaque based on the selected polymeric composition(s) of FD strands 22) and SD strands 24 comprise color(s), breakage of the thermal bond, and thus disruption of metal layer 30, at a crossover point 23 of the metalized FD and SD strands 22, 24 (via displacement of those metalized FD or SD strands 22, 24) would expose the colored, non-metalized section 24b of the SD strand 24 at that particular crossover point 23, i.e., the colored section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this colored, non-metalized section 24b of SD strand 24 would serve as an indicator that the bag and the contents thereof had been tampered with or otherwise accessed without authorization.

In an embodiment where FD strands 22 comprise color(s) and SD strands 24 are non-pigmented (and are transparent, semi-transparent, semi-opaque, or opaque based on the selected polymeric composition(s) of SD strands 24), breakage of the thermal bond, and thus disruption of metal layer 30, at a crossover point 23 of the metalized FD and SD strands 22, 24 (via displacement of those metalized FD or SD strands 22, 24) would expose the non-pigmented, non-metalized section 24b of the SD strand 24 at that particular crossover point 23, i.e., the non-pigmented section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this non-pigmented, non-metalized section 24b of SD strand 24 would serve as an indicator that the bag and the contents thereof had been tampered with or otherwise accessed without authorization.

In an embodiment where either or both of FD strands 22 and SD strands 24 is/are non-pigmented (and may be transparent, semi-transparent, semi-opaque or opaque based on the selected polymeric composition(s) of the FD strands 22 and SD strands 24, as applicable), breakage of the thermal bond, and thus disruption of metal layer 30, at a crossover point 23 of the metalized FD and SD strands 22, 24 (via displacement of those metalized FD or SD strands 22, 24) would expose the non-pigmented, non-metalized section 24b of the SD strand 24 at that particular crossover point 23, i.e., the non-pigmented section 24b on the front surface 24a of the SD strand 24 over which the FD strand 22 had been previously thermally bonded. In a tamper-evident security bag formed from the afore-described tamper-evident mesh material, where the metalized front surface 20a of mesh fabric 20 forms, at least in part, an exterior face of the security bag, the visibility of this non-pigmented, non-metalized section 24b of SD strand 24 would serve as an indicator that the bag and the contents thereof had been tampered with or otherwise accessed without authorization.

Mesh fabric 20 may be formed from any pigmented, unpigmented or colored polyolefin (including, without limitation, polyethylene) or other suitable polymers, and more preferably from a cross-laminated nonwoven pigmented, unpigmented or colored polyolefin fabric, including, without limitation, any such pigmented, unpigmented or colored nonwoven fabrics designated under the trademark CLAF® and available from JX Nippon ANCI, Inc. (including, without limitation, JX28 or other pigmented, unpigmented (also referred to as "natural") or colored CLAF® fabrics (see, www.claf.com/english/claf/properties/pdf/claf_grade.pdf)). JX28 fabric comprises FD strands (more specifically, CD strands) that are about 350 microns wide, and SD strands (more specifically, MD strands) that are about 907 microns wide. As such, if material 10 were formed from a metallized, and pigmented or unpigmented or colored, JX28 fabric, displacing a CD or MD strand thereof, and breaking the thermal bond at a crossover point of the CD and MD strands, would reveal a pigmented, unpigmented or colored (as applicable), non-metalized section of the MD strand measuring about 350 microns by about 907 microns at that particular crossover point.

Metallization of mesh fabric 20 may be achieved through a variety of metallization techniques and processes, including for example: (a) vacuum metallization (the process of evaporating a metal, such as aluminum or other selected metals, in a vacuum chamber, which evaporated metal then bonds to the desired substrate (here, mesh fabric 20), applying a uniform metalized layer thereover (mesh fabric 20 would be unwound and rewound within the chamber during application of metal layer 30 via the metallization process)), with such vacuum metallization processes available through Printpack, Inc. (www.printpack.com) and Polyplex Corporation Limited (www.polyplex.com); and, (b) sputter-coating technologies, such as those available through Eastman Chemical Company (www.eastman.com) and Vacuum Depositing Inc. (www.vdi-llc.com), which may be used to apply an array of metals to the substrate (here, mesh fabric 20), including stainless steel, titanium, aluminum, gold, copper, silver, and other metal or metal oxide alloys. Additionally, slit die coating, foam coating, or gravure printing, may be used to apply metallic or non-metallic coatings to mesh fabric 20, such that each section 24b of each SD strand 24 (over which FD strands 22 are thermally bonded) remains uncoated or unprinted. Referring now to FIGS. 2, 5 and 6-11, the tamper-evident mesh material of the present invention may be used in the manufacture of a tamper-evident security bag, pouch or other packaging, including: a bag 100 having one side 110 formed from film and the other side 120 formed from the tamper-evident mesh material 10 of the present invention (see, FIG. 6); a bag 200 having film sides 210, 212 with one or more windows 220 formed from the tamper-evident mesh material 10 of the present invention (see, FIG. 7); a bag 300 having both sides 310, 312 formed from the tamper-evident mesh material 10 of the present invention (see, FIG. 8); a bag 400 having film sides 410, 412 with one or more windows 420 formed from the tamper-evident mesh material 10 of the present invention (see, FIG. 9); a bag 500 having both sides 510, 512 formed from the tamper-evident mesh material 10 of the present invention, with a film section 520 interposed on side 512 (and optionally on side 510 (not shown)) (see, FIG. 10); or, a bag 600 having one side 610 formed from film and the other side 620 formed from the tamper-evident mesh material 10 of the present invention, with a film section 630 interposed on side 620 (see, FIG. 11). In each of bags 100, 200, 300, 400, 500 and 600, the metalized front surface 20a of mesh fabric 20 forms, at least in part, an exterior face of the bag. Breakage of the thermal bond, and thus disruption of metal layer 30, at a crossover point 23 of an overlying FD strand 22 and an underlying SD strand 24 of mesh fabric 20 (via displacement of those FD and SD strands 22, 24) exposes the pigmented, unpigmented or colored (as applicable), non-metalized section 24b of the underlying SD strand 24 at that particular crossover point 23, i.e., the pigmented, unpigmented or colored (as applicable) section 24b on the front surface 24a of the underlying SD strand 24 over which the overlying FD strand 22 had been previously thermally bonded (see, FIGS. 2, 5). Visibility of this pigmented, unpigmented or colored (as applicable), non-metalized section 24b of the underlying SD strand 24 would serve as an indicator that the bag (100, 200, 300, 400, 500 or 600) and the contents thereof had been tampered with or otherwise accessed without authorization. Bags 100, 200, 300, 400, 500 and 600 may be manufactured in accordance with any generally known and accepted bag manufacturing methods and practices, including, for example, side-sealed bag and tube bag manufacturing methods and practices. Tamper-evident tapes seals or other sealing strips may be incorporated into the mouth or opening of each such tamper-evident security bag, pouch or other packaging, including bags 100, 200, 300, 400, 500 and 600, also in accordance with generally known and accepted manufacturing methods and practices. Further, film sides or sections on any of the bags described herein may comprise printed text, designs, logos or other information or indicia. Ink or dye packs may be used in conjunction with a tamper-evident security bag manufactured from material 10, with such inks or dyes having the ability to pass through material 10 upon tampering with or unauthorized access to the bag or the contents thereof.

Additionally, any one or more of tamper-evident security bags 100, 200, 300, 400, 500 and 600 formed from a tamper-evident mesh material 10 of the present invention may serve to reduce or avoid the potential for "false positives"; that is, the potential for an inaccurate assessment that bags 100, 200, 300, 400, 500 or 600 and the contents thereof had suffered from tampering. By way of example but not limitation, in one embodiment of the present invention, any one or more of tamper-evident security bags 100, 200, 300, 400, 500 and 600, in which false positives may be reduced or avoided, may be formed from a tamper-evident mesh material 10 wherein FD strands 22 of mesh fabric 20 are pigmented a first color and SD strands 24 of mesh fabric 20 are pigmented a second color (and wherein the first color is different in color from the second color of the respective FD strands 22 and SD strands 24). In the event any use, transport or other handling of such a tamper-evident security bag 100, 200, 300, 400, 500 or 600 causes metal layer 30 to abrade from, for example, the front surface 22a of an FD strand 22 at a crossover point 23 of that FD strand 22 and an SD strand 24, a pigmented section (or the first color) of that FD strand 22 (from where metal layer 30 had been abraded) would be exposed. And, because the pigmentation (or first color) of each FD strand 22 is different in color from the pigmentation (or second color) of each SD strand 24, visibility of that pigmented section (or first color) on that FD strand 22 and not the pigmented section (or second color) of the SD strand 24 (i.e., at that particular crossover point 23, and where the FD strand 22 remains bonded over and to the SD strand 24) may serve to indicate that only the metal layer 30 had abraded from the front surface 22a of that FD strand 22 (at that particular crossover point 23), that the FD strand 22 or the SD strand 24 had not been displaced (at that particular crossover point 23), and that, thus, the bag and the contents thereof had not suffered from tampering (at least at that particular crossover point 23).

By way of further example but not limitation, in another embodiment of the present invention, any one or more of tamper-evident security bags 100, 200, 300, 400, 500 and 600, in which false positives may be reduced or avoided, may be formed from a tamper-evident mesh material 10 wherein FD strands 22 of mesh fabric 20 are non-pigmented (and are transparent or semi-transparent based on the selected polymeric composition(s) of FD strands 22) and SD strands 24 are pigmented. In the event any use, transport or other handling of such a tamper-evident security bag 100, 200, 300, 400, 500 or 600 causes metal layer 30 to abrade from, for example, the front surface 22a of an FD strand 22 at a crossover point 23 of that FD strand 22 and an SD strand 24, a non-pigmented (and transparent or semi-transparent) section of that FD strand 22 (from where metal layer 30 had been abraded) would be exposed. And, because each FD strand 22, without pigmentation, may be transparent or semi-transparent (by virtue of the selected polymeric composition(s) of the FD strand 22), a pigmented section of the SD strand 24 would then be visible through the exposed (and transparent or semi-transparent) non-pigmented section of the FD strand 22 (i.e., at that particular crossover point 23, and where the FD strand 22 remains bonded over and to SD strand 24). Visibility of that pigmented section on that SD strand 24 (through the exposed (and transparent or semi-transparent) non-pigmented section of FD strand 22 bonded thereover) may serve to indicate that only the metal layer 30 had abraded from the front surface 22a of that FD strand 22 (at that particular crossover point 23), that the FD strand 22 or the SD strand 24 had not been displaced (at that particular crossover point 23), and that, thus, the bag and the contents thereof had not suffered from tampering (at least at that particular crossover point 23).

Further such tamper-evident security bags 100, 200, 300, 400, 500 and 600, in which false positives may be reduced or avoided, may be formed from a tamper-evident mesh material 10 wherein the visual property of FD strands 22 (i.e., the pigmentation, non-pigmentation, or color(s) of FD strands 22) is visually distinct from the visual property of SD strands 24 (i.e., the pigmentation, non-pigmentation, or color(s) of SD strands 24).

Referring now to FIGS. 12 and 13, in a further embodiment of the present invention, tamper-evident mesh material 10 may comprise contrast layer 25 in the form of a printed layer or coating applied over front surface 20a of pigmented mesh fabric 20, instead of metal layer 30. The printed layer or coating (print/coating 50) may be an acrylic or urethane ink or coating, or other ink or coating suited for the application contemplated herein. Similar to each of the "metalized" embodiments described hereinabove, in this print/coating embodiment, nonwoven mesh fabric 20 comprises FD strands 22 disposed over and thermally (or otherwise) bonded to SD strands 24 at substantially each of crossover points 23, i.e., at substantially each point where the FD strands 24 cross over and contact the underlying SD strands 24. Here as well, FD strands 22 may be, for example, a plurality of pigmented, unpigmented or colored strands generally oriented in the cross machine direction (cross machine direction (or CD) strands), and SD strands 24 may be, for example, a plurality of pigmented, unpigmented or colored strands generally oriented in the machine direction (machine direction (or MD) strands), or vice versa. A print/coating layer 50 is disposed over front surface 20a of mesh fabric 20 to conceal the pigmentation, non-pigmentation or color(s) (as applicable) thereof, and, more precisely, to conceal the pigmentation, non-pigmentation or color(s) (as applicable) (i.e., the visual property) of front surfaces 22a, 24a, respectively, of FD and SD strands 22, 24. Specifically, the print/coating layer 50 extends over the entire front surface 22a of each FD strand 22, and over front surface 24a of each SD strand 24 except for those sections 24b on the front surface 24a of each SD strand 24 over which FD strands 22 are thermally bonded (namely, at substantially each of crossover points 23). Stated differently, front surface 22a of each FD strand 22 includes the print/coating layer 50, and front surface 24a of each SD strand 24 also includes the print/coating layer 50; however, the sections 24b on the front surface 24a of each SD strand 24 over which FD strands 22 are thermally bonded do not include the print/coating layer 50, as those sections 24b were shielded during the printing/coating process by sections 22b of FD strands 22 thermally bonded thereover. Consequently, breakage of the thermal bond, and thus disruption of the print/coating layer 50, at a crossover point 23 of the FD and SD strands 22, 24 (via displacement of those FD or SD strands 22, 24) exposes the unprinted/uncoated section 24b (and thus the pigmentation, non-pigmentation or color(s) (i.e., the visual property), as applicable) of the SD strand 24 at that particular crossover point 23, i.e., the pigmented, non-pigmented or colored (as applicable) section 24b on the front surface 24a of the SD strand 24 over which the FD strand 22 had been previously thermally bonded. In a tamper-evident security bag (including bag structures similar to any one or more of bags 100, 200, 300, 400, 500 or 600) formed from the tamper-evident mesh material of this "print/coating" embodiment, where the print/coating layer 50 of the front surface 20a of the mesh fabric 20 forms, at least in part, an exterior face of the security bag, the visibility of this unprinted/uncoated section 24b (and thus the pigmentation, non-pigmentation or color(s), as applicable) of the SD strand 24 would serve as an indicator that the bag and the contents thereof had been tampered with or otherwise accessed without authorization.

In yet a further embodiment of the present invention, the tamper-evident mesh material of the present invention is formed from a metalized, nonwoven mesh fabric, wherein the nonwoven mesh fabric comprises three or more pluralities of strands, each such plurality of strands oriented in a direction different from the other plurality(ies) of strands, with a first such plurality of strands thermally bonded over a second such plurality of strands at a plurality of crossover points (and with the third and any such further plurality(ies) of strands thermally bonded, in succession, thereunder). Each of the three or more pluralities of strands is either pigmented, non-pigmented or colored, and each of the strands of each plurality of strands is metalized. Specifically, through a metallization process, a metal layer is disposed over, for example, the front surface of each strand in each plurality of strands to conceal the pigmentation, non-pigmentation or color(s) (as applicable) of those front surfaces; however, sections on the front surfaces of those strands over which other strands are thermally bonded (namely, at the plurality of crossover points) are not metalized, as those sections on the front surfaces of those strands were shielded during the metallization process by sections of the other strands thermally bonded thereover. Breakage of the thermal bond, and thus disruption of the metal layer, at a crossover point of an overlying and an underlying metalized strand (via displacement of those metalized strands) exposes the pigmented, non-pigmented or colored (as applicable), non-metalized section of the underlying strand at that particular crossover point, i.e., the pigmented, non-pigmented or colored (as applicable) section on the front surface of the underlying strand over which the overlying strand had been previously thermally bonded. In a tamper-evident security bag formed from the tamper-evident mesh material of this further embodiment, the visibility of that pigmented, non-pigmented or colored (as applicable), non-metalized section on that strand would serve as an indicator that the bag and the contents thereof had been tampered with or otherwise accessed without authorization. It is contemplated that, in this further embodiment, a print/coated layer may be used instead of the metal layer.

It is contemplated herein that both the front and back surfaces of mesh fabric 20, and thus the front and back surfaces of FD and SD strands 22, 24, may comprise the metal layer, print layer or coating described hereinabove, thus concealing the pigmentation, non-pigmentation or color(s) (as applicable) of all surfaces of mesh fabric 20 with the exception of those surface sections of FD and SD strands 22, 24 thermally bonded to each other at substantially each of the crossover points 23 thereof. Accordingly, breakage of the thermal bond (and thus disruption of the metal layer, print layer or coating, as applicable) at a crossover point 23 of the FD and SD strands 22, 24, would expose the pigmented, non-pigmented or colored (as applicable) (and non-metalized, unprinted, or uncoated, as applicable) surface sections of each of FD and SD strands 22, 24 at that particular crossover point 23, i.e., the pigmented, non-pigmented or colored (as applicable) sections on the back and the front surfaces, respectively, of FD and SD strands 22, 24, where FD and SD strands 22, 24 had been previously thermally bonded to each other. In a tamper-evident security bag formed from such a tamper-evident mesh material, the visibility of this pigmented, non-pigmented or colored (as applicable) section of SD strand 24 would serve as an indicator that the bag and the contents thereof had been tampered with or otherwise accessed without authorization.

It is further contemplated herein that mesh fabric 20 may also be formed from a spunbonded fabric, another type of nonwoven fabric, characterized by fine fibers or strands, a relatively random orientation of such strands, and a plurality of crossover points between or among the strands thereof. Accordingly, similar to the above-described embodiments, if mesh fabric 20 were formed from a pigmented, non-pigmented or colored spunbonded fabric having a metal (or print or coated) layer disposed over at least one surface thereof, breaking the thermal bond(s), and thus disrupting the metal (or print or coated) layer, at one or more crossover points between or among the strands (by displacing or shifting one or more such strands, or by stretching the fabric to so displace or shift one or more such strands), would expose the pigmented, non-pigmented or colored (as applicable) (and non-metalized, unprinted, or uncoated, as applicable) surface(s) of the one or more strands at the corresponding crossover point(s). In addition to the foregoing, mesh fabric 20 may also be formed from other pigmented, non-pigmented or colored nonwoven fabrics, including, for example, carded web fabrics and meltblown fabrics.

While the invention has been described with reference to certain exemplary embodiments thereof, those skilled in the art may make various modifications to the described embodiments of the invention without departing from the scope of the invention. The terms and descriptions used herein are set forth by way of illustration only and not meant as limitations. Although the invention has been described and disclosed in various terms and certain embodiments, the scope of the invention is not intended to be, nor should it be deemed to be, limited thereby and such other modifications or embodiments as may be suggested by the teachings herein are particularly reserved, especially as they fall within the breadth and scope of the claims here appended. Those skilled in the art will recognize that these and other variations are possible within the scope of the invention as defined in the following claims and their equivalents.

What is claimed is:

1. A tamper-evident mesh material comprising:
  a nonwoven mesh fabric, said mesh fabric comprising a plurality of strands, said plurality of strands comprising overlying strands and underlying strands, wherein said underlying strands comprise a visual property, and wherein said overlying strands are bonded to said underlying strands at a plurality of crossover points; and,
  a contrast layer, wherein said contrast layer is visually distinct from said visual property of said underlying strands, and wherein said contrast layer is disposed over at least a portion of each said overlying strand and each said underlying strand, and over said plurality of crossover points,
  wherein breakage of a bond between at least one of said overlying strands and at least one of said underlying strands at a crossover point of said plurality of crossover points exposes said visual property of said at least one underlying strand at said crossover point to indicate breakage of said bond.

2. The tamper-evident mesh material of claim 1, wherein said overlying strands are oriented in a first direction and disposed over said underling strands, and wherein said underlying strands are oriented in a second direction.

3. The tamper-evident mesh material of claim 1, wherein said overlying strands comprise a visual property.

4. The tamper-evident mesh material of claim 3, wherein said contrast layer is disposed over at least a front surface of each said overlying strand and each said underlying strand to conceal on each said front surface said visual property of each said overlying strand and said visual property of each said underlying strand, except for sections on said front surface of each said underlying strand over which said overlying strands are bonded.

5. The tamper-evident mesh material of claim 4, wherein said visual property of said overlying strands is a pigmentation.

6. The tamper-evident mesh material of claim 4, wherein said visual property of said overlying strands is a non-pigmentation.

7. The tamper-evident mesh material of claim 4, wherein said visual property of said overlying strands is one or more colors.

8. The tamper-evident mesh material of claim 4, wherein said visual property of said underlying strands is a pigmentation.

9. The tamper-evident mesh material of claim 4, wherein said visual property of said underlying strands is a non-pigmentation.

10. The tamper-evident mesh material of claim 4, wherein said visual property of said underlying strands is one or more colors.

11. The tamper-evident mesh material of claim 4, wherein said visual property of said overlying strands is a non-pigmentation, and wherein said visual property of said underlying strands is a pigmentation.

12. The tamper-evident mesh material of claim 4, wherein said visual property of said overlying strands is a pigmentation, and wherein said visual property of said underlying strands is a pigmentation.

13. The tamper-evident mesh material of claim 1, wherein said contrast layer is a metal layer.

14. The tamper-evident mesh material of claim 13, wherein said metal layer is selected from the group consisting of stainless steel, titanium, aluminum, gold, copper, silver, metal, metal oxide alloys, and combinations thereof.

15. The tamper-evident mesh material of claim 1, wherein said contrast layer is a printed or coated layer.

16. The tamper-evident mesh material of claim 15, wherein said contrast layer is selected from the group consisting of acrylic inks, urethane inks, acrylic coatings, urethane coating, and combinations thereof.

17. A tamper-evident bag comprising:
  a first side, a second side, an opening and a bottom;
  at least a portion of at least one of said first side, said second side and said bottom formed from a tamper evident mesh material;
  said tamper evident mesh material comprising a nonwoven mesh fabric, said mesh fabric comprising a plurality of strands, said plurality of strands comprising overlying strands and underlying strands, wherein said underlying strands comprise a visual property, and wherein said overlying strands are bonded to said underlying strands at a plurality of crossover points; and,
  a contrast layer, wherein said contrast layer is visually distinct from said visual property of said underlying strands, and wherein said contrast layer is disposed over at least a portion of each said overlying strand and each said underlying strand, and over said plurality of crossover points, wherein breakage of a bond between at least one of said overlying strands and at least one of said underlying strands at a crossover point of said plurality of crossover points exposes said visual property of said at least one underlying strand at said crossover point to indicate breakage of said bond.

18. The tamper-evident bag of claim 17, wherein said overlying strands are oriented in a first direction and disposed over said underling strands, and wherein said underlying strands are oriented in a second direction.

19. The tamper-evident bag of claim 17, wherein said overlying strands comprise a visual property.

20. The tamper-evident bag of claim 19, wherein said contrast layer is disposed over at least a front surface of each said overlying strand and each said underlying strand to conceal on each said front surface said visual property of each said overlying strand and said visual property of each said underlying strand, except for sections on said front surface of each said underlying strand over which said overlying strands are bonded.

21. The tamper-evident bag of claim 20, wherein said visual property of said overlying strands is a pigmentation.

22. The tamper-evident bag of claim 20, wherein said visual property of said overlying strands is a non-pigmentation.

23. The tamper-evident bag of claim 20, wherein said visual property of said overlying strands is one or more colors.

24. The tamper-evident bag of claim 20, wherein said visual property of said underlying strands is a pigmentation.

25. The tamper-evident bag of claim 20, wherein said visual property of said underlying strands is a non-pigmentation.

26. The tamper-evident bag of claim 20, wherein said visual property of said underlying strands is one or more colors.

27. The tamper-evident bag of claim 20, wherein said visual property of said overlying strands is a non-pigmentation, and wherein said visual property of said underlying strands is a pigmentation.

28. The tamper-evident bag of claim 20, wherein said visual property of said overlying strands is a pigmentation, and wherein said visual property of said underlying strands is a pigmentation.

29. The tamper-evident bag of claim 17, wherein said contrast layer is a metal layer.

30. The tamper-evident bag of claim 29, wherein said metal layer is selected from the group consisting of stainless steel, titanium, aluminum, gold, copper, silver, metal, metal oxide alloys, and combinations thereof.

31. The tamper-evident bag of claim 17, wherein said contrast layer is a printed or coated layer.

32. The tamper-evident bag of claim 31, wherein said contrast layer is selected from the group consisting of acrylic inks, urethane inks, acrylic coatings, urethane coating, and combinations thereof.

* * * * *

UNITED STATES PATENT AND TRADEMARK OFFICE
CERTIFICATE OF CORRECTION

PATENT NO.         : 10,597,196 B2
APPLICATION NO.    : 15/786418
DATED              : March 24, 2020
INVENTOR(S)        : Marc Levillain Page 1 of 1

It is certified that error appears in the above-identified patent and that said Letters Patent is hereby corrected as shown below:

In the Claims

Claim 2, Column 20, Line 3 reads:
"disposed over said underling strands, and wherein said"

Should read:
--disposed over said underlying strands, and wherein said--

Claim 18, Column 21, Lines 12-14 read:
"overlying strands are oriented in a first direction and disposed over said underling strands, and wherein said underlying strands are oriented in a second direction."

Should read:
--overlying strands are oriented in a first direction and disposed over said underlying strands, and wherein said underlying strands are oriented in a second direction.--

Signed and Sealed this
Twenty-seventh Day of October, 2020

Andrei Iancu
*Director of the United States Patent and Trademark Office*